(12) United States Patent
Nakagawa (10) Patent No.: US 8,008,838 B2
(45) Date of Patent: Aug. 30, 2011

(54) LAMB WAVE TYPE ELASTIC WAVE DEVICE

(75) Inventor: Yasuhiko Nakagawa, Yamanashi (JP)

(73) Assignee: University of Yamanashi, Kofu-Shi (JP)

( * ) Notice: Subject to any disclaimer, the term of this patent is extended or adjusted under 35 U.S.C. 154(b) by 161 days.

(21) Appl. No.: 12/531,385

(22) PCT Filed: Mar. 14, 2008

(86) PCT No.: PCT/JP2008/054717
§ 371 (c)(1),
(2), (4) Date: Sep. 15, 2009

(87) PCT Pub. No.: WO2008/114715
PCT Pub. Date: Sep. 25, 2008

(65) Prior Publication Data
US 2010/0102668 A1   Apr. 29, 2010

(30) Foreign Application Priority Data
Mar. 15, 2007   (JP) .................. 2007-065991

(51) Int. Cl.
*H03H 9/25* (2006.01)
(52) U.S. Cl. ................. 310/313 A; 310/313 D
(58) Field of Classification Search ........... 310/313 R, 310/313 A, 313 B, 313 D
See application file for complete search history.

(56) References Cited

U.S. PATENT DOCUMENTS

| | | |
|---|---|---|
| 2006/0152107 A1 | 7/2006 | Tanaka |
| 2010/0102668 A1* | 4/2010 | Nakagawa ............. 310/313 A |
| 2010/0237742 A1* | 9/2010 | Tanaka ................. 310/313 D |
| 2010/0237959 A1* | 9/2010 | Tanaka ................. 331/158 |

FOREIGN PATENT DOCUMENTS

| | | |
|---|---|---|
| JP | 2003-258596 A | 9/2003 |
| JP | 2005-269284 A | 9/2005 |
| JP | 2006-217566 A | 8/2006 |

OTHER PUBLICATIONS

Nakagawa, Yasuhiko et al. "Temperature Characteristics of the Substrate for Lamb Wave Type Elastic Wave Devices", The Transactions of the Institute of Electronics, Information and Communication Engineers C, Electronics, Jan. 1, 2006, vol. J89-C No. 1, pp. 34-39.

(Continued)

*Primary Examiner* — Thomas M Dougherty
(74) *Attorney, Agent, or Firm* — Birch, Stewart, Kolasch & Birch, LLP (57) ABSTRACT

Provided is a device of a high-frequency resonator using Lamb wave type elastic wave having excellent frequency temperature characteristics, the device having a significantly small frequency change, and including an interdigital transducer for generating at least one Lamb wave type elastic wave, or the interdigital transducer and a reflector, arranged on a quartz substrate. The cut angle of the quartz substrate and a propagation direction of the Lamb wave type elastic wave expressed in Euler angles ($\lambda$, $\mu$, $\theta$) satisfy any one of following expressions (Expressions 1 to 3):

$\lambda=90°$, $\mu=17°$ to $21°$ or $\mu=159°$ to $163°$, $\theta=0°$ to $10°$   (Expression 1)

$\lambda=210°$, $\mu=17°$ to $21°$ or $\mu=159°$ to $163°$, $\theta=0°$ to $10°$   (Expression 2)

$\lambda=330°$, $\mu=17°$ to $21°$ or $\mu=159°$ to $163°$, $\theta=0°$ to $10°$.   (Expression 3)

9 Claims, 10 Drawing Sheets

OTHER PUBLICATIONS

Yoshida, Hitoshi et al. "Propagation characteristics of substrate for Lamb wave type elastic wave devices", Proceedings of Piezoelectric Materials & Devices Symposium, Jan. 24, 2008, vol. 2008 pp. 89-91.

Anisimkin, I.V. et al. "Temperature Sensitivity of Plate Modes in St-Quartz", Oct. 10, 2001, vol. 1, IEEE Ultrasonics Symposium pp. 423-426.

International Search Report for PCT/JP2008/054717 dated Jun. 17, 2008.

* cited by examiner

LAMB WAVE TYPE ELASTIC WAVE DEVICE

TECHNICAL FIELD

The present invention relates to a device like a vibrator used in a frequency filter, a resonator and the like, and particularly to an elastic wave device having extremely stable frequency temperature characteristics using Lamb wave type elastic wave on a quartz substrate.

BACKGROUND ART

Quartz is a physically and chemically extremely stable crystal and does not change much with time. Hence, it has been widely used as a quartz vibrator for a long time. The quartz vibrator is an electronic device which takes out mechanical resonance of the quartz crystal as stable electric vibration via piezoelectricity and is essential as a reference clock for operation of an electronic circuit. Besides, the quartz vibrator is widely used as standards for frequency of the oscillator, filter and so on, and utilized in not only information processing devices but also almost all, various electronic devices. Such wide use of the quartz vibrator is due to its temperature-dependent frequency change of the quartz vibrator that is much smaller than that of another electronic device.

When using a vibrator or resonator in an electronic device, the frequency temperature characteristic of the vibrator is extremely important and many efforts have been made to improve this characteristic. The vibrator substrate having the most stable frequency temperature characteristics at present is an AT-cut quartz substrate using bulk waves (thickness-shear waves). Generalized frequency temperature characteristics of the AT-cut quartz vibrator are expressed by a cubic function, and a frequency change is small and about 12 ppm over a general ambient temperature range (−20 to +80 degrees).

In addition, the quartz vibrator using surface acoustic waves has entered widespread use, however, it generally has a drawback of inferior frequency temperature characteristic. For example, an ST-cut quartz widely used as a surface acoustic wave substrate has frequency temperature characteristics expressed by a quadratic function and its frequency change is about 10 times larger than that of the AT-cut quartz.

Meanwhile, the inventors have proposed, as a vibrator using elastic waves different from the conventional surface acoustic waves or bulk waves, a high-frequency resonator using Lamb wave type elastic waves (Patent documents 1 and 2).

However, the frequency temperature characteristics disclosed in these documents show the frequency variation (Δf/f) of about 1.7 ppm over the temperature range of −20 to +80 degrees, which is about one eighth of that of the conventional AT-cut quartz vibrator. When the band of one channel is of hundreds GHz or more, the frequency variation becomes several tens kHz and there may be channel-to-channel interference.

[Patent Document 1] Japanese Patent Application Laid-open No. 2003-258596

[Patent Document 1] Japanese Patent Application Laid-open No. 2005-269284

DISCLOSURE OF THE INVENTION

Problem to be Solved by the Invention

In response to demands for higher speed and increasing capacity of information communications, the reference clock frequency of a communication device becomes higher and higher and has entered several tens GHz to several hundreds GHz band. As the frequency of the reference clock is higher, an absolute value of the temperature-dependent frequency change becomes larger. For example, when the frequency is 20 GHz, the change of 2 ppm corresponds to 40 kHz, and in order to reduce into 30 kHz, for example, there may occur channel-to-channel interference. Therefore, further reduction of the temperature-dependent frequency change is also required for the conventional high-frequency resonator using Lamb wave type elastic wave.

Then, the present invention provides a device of a high-frequency resonator using Lamb wave type elastic wave having presently most excellent frequency temperature characteristics, the device having less frequency change. More specifically, the present invention provides a device having a temperature-dependent frequency change of 1 ppm or less over the temperature range of −20 to +80 degrees by using Lamb wave type elastic wave on the quartz substrate.

Means for Solving the Problem

The elastic wave device of this invention utilizes Lamb wave. The Lamb wave is an elastic wave propagating in the surface direction on a substrate having the same level of or smaller thickness which is comparable to the wavelength, and its another name is "plate wave". When the substrate thickness is equal to or less than 5 times wavelength of the Lamb wave, the Lamb wave can be generated effectively. The high-frequency resonator using the Lamb wave has an interdigital transducer (IDT) for exciting the Lamb wave on one surface of a piezoelectric substrate and reflectors arranged on the respective sides thereof. The operating frequency f of the resonator can be given by f=V/Λ, in which V is a phase velocity of the Lamb wave and Λ is a wavelength of the Lamb wave (=periodic length of the transducer).

The inventors have made theoretical analysis of the phase velocity of the Lamb wave and then theoretical computations of the temperature characteristics of the operation frequency f based on the temperature dependence of material constants of the quartz crystal. Then, they have compared computation values and measurement values of the temperature characteristics of the AT-cut quartz substrate, found that they are in good agreement and confirmed that this theoretical computation method is appropriate. Besides, as the material constants of the crystal depend on cut angle and propagation direction of the Lamb wave, they have explored conditions for smaller frequency temperature change Δf/f by changing the cut angle and propagation direction. They have finally found there is a range where Δf/f of the Lamb wave became significantly small.

Based on these findings, one aspect of the present invention is (1) a Lamb wave type elastic wave device having an interdigital transducer for generating at least one Lamb wave type elastic wave, or the interdigital transducer and a reflector, arranged on a quartz substrate, a cut angle of the quartz substrate and a propagation direction of the Lamb wave type elastic wave expressed in Euler angles (λ, μ, θ) satisfying any one of following expressions (Expressions 1 to 3).

$\lambda=90°, \mu=17°$ to $21°$ or $\mu=159°$ to $163°, \theta=0°$ to $10°$ (Expression 1)

$\lambda=210°, \mu=17°$ to $21°$ or $\mu=159°$ to $163°, \theta=0°$ to $10°$ (Expression 2)

$\lambda=330°, \mu=17°$ to $21°$ or $\mu=159°$ to $163°, \theta=0°$ to $10°$ (Expression 3)

More specifically, the interdigital transducer and the like are arranged on the cut surface which falls within ranges of $\lambda=90°$ and $\mu=17°$ to $21°$ or $\mu=159°$ to $163°$ in such a manner that the interdigital transducer can generate the Lamb wave type elastic wave in the propagation direction of $\theta=0°$ to $10°$, the interdigital transducer and the like are arranged on the cut surface which falls within ranges of $\lambda=210°$ and $\mu=17°$ to $21°$ or $\mu=159°$ to $163°$ in such a manner that the interdigital transducer can generate the Lamb wave type elastic wave in the propagation direction of $\theta=0°$ to $10°$, or the interdigital transducer and the like are arranged on the cut surface which falls within ranges of $\lambda=330°$ and $\mu=17°$ to $21°$ or $\mu=159°$ to $163°$ in such a manner that the interdigital transducer can generate the Lamb wave type elastic wave in the propagation direction of $\theta=0°$ to $10°$.

Further, the Lamb wave type elastic wave device (1) is characterized in that a ratio $H/\Lambda$ of a thickness H of the quartz substrate to a periodic length $\Lambda$ of the interdigital transducer ranges from 0.8 to 1.0.

Another aspect of the present invention is (2) a Lamb wave type elastic wave device having an interdigital transducer for generating at least one Lamb wave type elastic wave, or the interdigital transducer and a reflector, arranged on a quartz substrate, a cut angle of the quartz substrate and a propagation direction of the Lamb wave type elastic wave expressed in Euler angles ($\lambda$, $\mu$, $\theta$) satisfying any one of following expressions (Expressions 4 to 6).

$\lambda=90°$, $\mu=13°$ to $16°$ or $\mu=164°$ to $167°$, $\theta=0°$ to $10°$ (Expression 4)

$\lambda=210°$, $\mu=13°$ to $16°$ or $\mu=164°$ to $167°$, $\theta=0°$ to $10°$ (Expression 5)

$\lambda=330°$, $\mu=13°$ to $16°$ or $\mu=164°$ to $167°$, $\theta=0°$ to $10°$ (Expression 6)

More specifically, the interdigital transducer and the like are arranged on the cut surface which falls within ranges of $\lambda=90°$ and $\mu=13°$ to $16°$ or $\mu=164°$ to $167°$ in such a manner that the interdigital transducer can generate the Lamb wave type elastic wave in the propagation direction of $\theta=0°$ to $10°$, the interdigital transducer and the like are arranged on the cut surface which falls within ranges of $\lambda=210°$ and $\mu=13°$ to $16°$ or $\mu=164°$ to $167°$ in such a manner that the interdigital transducer can generate the Lamb wave type elastic wave in the propagation direction of $\theta=0°$ to $10°$, or the interdigital transducer and the like are arranged on the cut surface which falls within ranges of $\lambda=330°$ and $\mu=13°$ to $16°$ or $\mu=164°$ to $167°$ in such a manner that the interdigital transducer can generate the Lamb wave type elastic wave in the propagation direction of $\theta=0°$ to $10°$.

Further, the Lamb wave type elastic wave device (2) is characterized in that a ratio $H/\Lambda$ of a thickness H of the quartz substrate to a periodic length $\Lambda$ of the interdigital transducer ranges from 0.9 to 1.1.

Yet another aspect of the present invention is (3) a Lamb wave type elastic wave device having an interdigital transducer for generating at least one Lamb wave type elastic wave, or the interdigital transducer and a reflector, arranged on a quartz substrate, a cut angle of the quartz substrate and a propagation direction of the Lamb wave type elastic wave expressed in Euler angles ($\lambda$, $\mu$, $\theta$) satisfying any one of following expressions (Expressions 7 to 9).

$\lambda=20°$ to $25°$, $\mu=120°$ to $130°$, $\theta=40°$ to $45°$ (Expression 7)

$\lambda=140°$ to $145°$, $\mu=120°$ to $130°$, $\theta=40°$ to $45°$ (Expression 8)

$\lambda=260°$ to $265°$, $\mu=120°$ to $130°$, $\theta=40°$ to $45°$ (Expression 9)

Further, the Lamb wave type elastic wave device (3) is characterized in that a ratio $H/\Lambda$ of a thickness H of the quartz substrate to a periodic length $\Lambda$ of the interdigital transducer ranges from 0.9 to 1.1.

Yet another aspect of the present invention is a Lamb wave type elastic wave device having an interdigital transducer for generating at least one Lamb wave type elastic wave, or the interdigital transducer and a reflector, arranged on a quartz substrate, a cut angle of the quartz substrate and a propagation direction of the Lamb wave type elastic wave expressed in Euler angles ($\lambda$, $\mu$, $\theta$) satisfying a following expression (Expression 10), and a ratio $H/\Lambda$ of a thickness H of the quartz substrate to a periodic length $\Lambda$ of the interdigital transducer is 0.9.

$\lambda=90°$, $\mu=18.997°$ or $\mu=180°-18.997°$, $\theta=7.5°$ (Expression 10)

Yet another aspect of the present invention is a Lamb wave type elastic wave device having an interdigital transducer for generating at least one Lamb wave type elastic wave, or the interdigital transducer and a reflector, arranged on a quartz substrate, a cut angle of the quartz substrate and a propagation direction of the Lamb wave type elastic wave expressed in Euler angles ($\lambda$, $\mu$, $\theta$) satisfying a following expression (Expression 11), and a ratio $H/\Lambda$ of a thickness H of the quartz substrate to a periodic length $\Lambda$ of the interdigital transducer is 0.9.

$\lambda=90°$, $\mu=14.715°$ or $\mu=180°-14.715°$, $\theta=0°$ (Expression 11)

Yet another aspect of the present invention includes a high-frequency resonator having any one of the above-described Lamb wave type elastic wave device.

Effect of the Invention

The temperature-dependent frequency change of the Lamb wave type elastic wave device is small and about 1 ppm or less over the temperature range of −20 to 80 degrees. This is about 1/20 of the frequency change of the AT-cut quartz substrate that exhibits the currently most stable frequency temperature characteristics.

In this way, the piezoelectric substrate excellent in frequency temperature characteristics can be used as a reference clock for not only information processing devices but also various signal generators.

EXPLANATION OF REFERENCE NUMERALS 1 quartz substrate
2 interdigital transducer
3 reflector

BEST MODE FOR CARRYING OUT THE INVENTION

FIGS. 1(a) and 1(b) are diagrams each illustrating the configuration of the Lamb wave type high-frequency resonator according to an exemplary embodiment of the present invention, and FIG. 1(a) is a perspective view and FIG. 1(b) is a cross sectional view. On a surface of a quartz substrate 1 that is thinner than or as thin as a wavelength of generated Lamb wave, an IDT 2 for Lamb wave excitation and reflectors 3 utilizing elastic perturbation effect. The transducer is often made of aluminum and the reflectors may be made of aluminum, gold, chromium or the like. The operating frequency f of this resonator is given by (phase velocity V/wavelength) of the Lamb wave propagating on the substrate 1. As the wavelength is equal to a periodic length of $\Lambda$ of the IDT 2, f is expressed by the following expression (Expression 12).

$$f=V/\Lambda \quad \text{(Expression 12)}$$

The temperature dependence of the frequency is determined, from the above-mentioned expression (Expression 12), by the temperature dependence V(T) of the phase velocity and the expansion coefficient of the substrate (temperature change of $\Lambda$). The temperature characteristic of the frequency change is often set with a usual reference temperature of 20° C. Therefore, if the operating frequency f(T) at a temperature and the operating frequency f (20° C.) at the temperature of 20° C. are determined, the frequency temperature change $\Delta f/f$ can be obtained by the following expression (Expression 13).

$$\Delta f/f = \{f(T)-f(20° C.)\}/f(20° C.) \quad \text{(Expression 13)}$$

Figure 2:
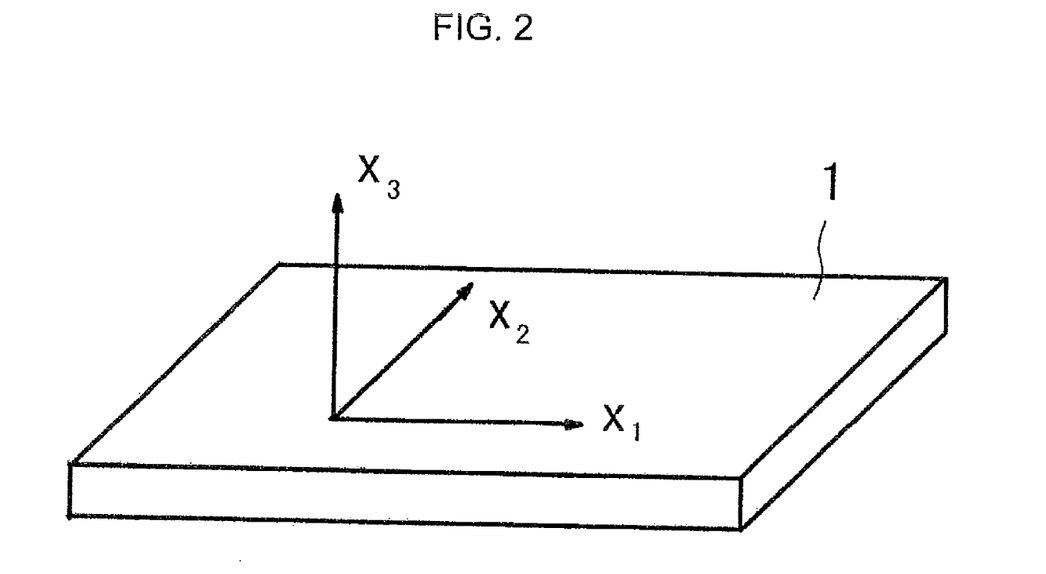
FIG. 2 is a view illustrating a coordinate system of Lamb wave analysis model.

The phase velocity of the Lamb wave propagating on the flat plate can be determined by the following theoretical analysis. FIG. 2 is a view of a coordinate system of the analysis model, and an elastic wave in the propagation direction x1 is analyzed with a substrate thickness of H. The dynamic equation and piezoelectric basic expression are used to determine a general solution of a wave motion in the propagation direction of x1 axis. Then, a boundary condition is put on the determined general solution thereby to determine the phase velocity V of the Lamb wave. The boundary condition is a stress=0 on the upper surface and lower surface of the substrate.

A value of the phase velocity at the temperature T can be determined by the theoretical analysis using a value of each material coefficient (elastic constant, piezoelectric constant, dielectric constant and density) of the quartz crystal at the temperature T (° C.). For each material constant, a value at the reference temperature (generally 20° C.) and the temperature coefficient are measured.

Figure 3:
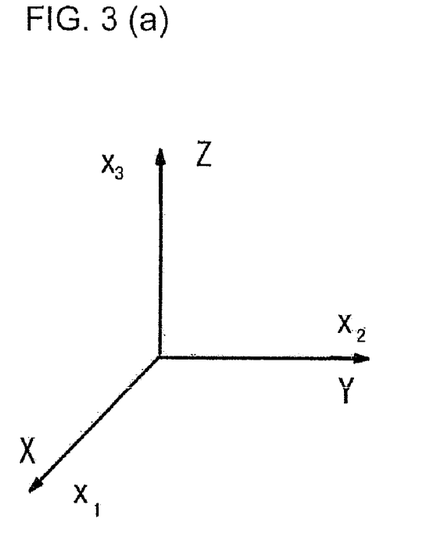
FIGS. 3(a) to 3(d) are views each for explaining Euler angle representation.

A wave propagation characteristic and a cut angle of the crystal substrate are generally expressed in Euler angles, of which definition is explained with reference to FIGS. 3(a) to 3(d). In FIGS. 3(a) to 3(d), X, Y and Z are crystal axes and x1, x2 and x3 are coordinate axes. In FIG. 3(a), the crystal axes and the coordinate axes are in good agreement and $\lambda$, $\mu$, and $\theta$ of the Euler angles ($\lambda$, $\mu$, $\theta$) are all zero. The value $\lambda$ is an angle for rotating the X-Y plane in a right screw direction (from X axis to Y axis) on the rotation axis of Z axis, and this rotation is used to determine an orientation of the coordinate axis x1 (equivalent to the position of the X axis after rotation, see FIG. 3(b)). The value $\mu$ is an angle for rotating a plane perpendicular to the x1 axis in a right screw direction (from x2 axis to x3 axis) on the rotation axis of x1, and this rotation is used to determine an orientation of the coordinate axis x3 (equivalent to the position of the Z axis after rotation, see FIG. 3(c)).

The cut surface of the crystal substrate is a plane perpendicular to the above-mentioned x3 axis. The value $\theta$ is an angle for defining the propagation direction, which angle is for rotating the plane perpendicular to the above-mentioned x3 axis in the right screw direction (from the x1 axis to the x2 axis) on the rotation axis of x3 axis. The direction of the x1 axis determined by this rotation is defined as the propagation direction of the wave (see FIG. 3(d)). The above-mentioned material constants depend on the direction in the crystal substrate, however, the material constants for a new coordinate system (x1, x2, x3) can be determined with use of the Euler angles.

Figure 4:
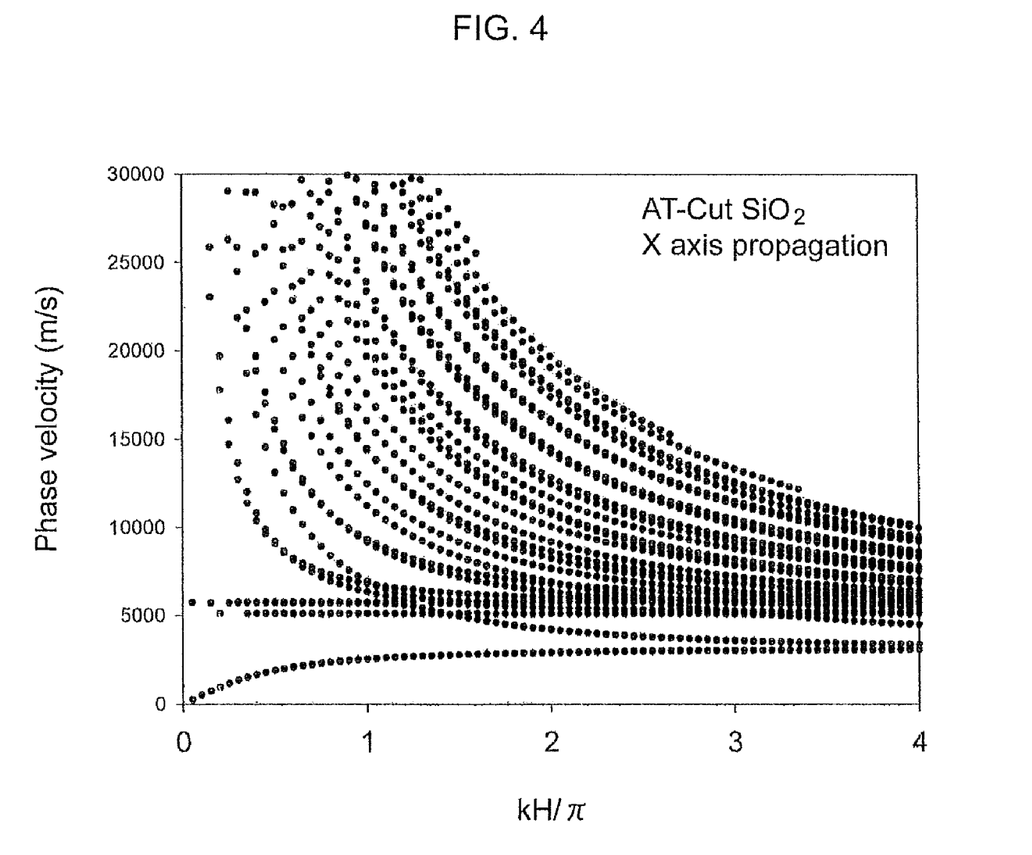
FIG. 4 is a view illustrating an example of computation results of frequency temperature characteristics of the Lamb wave type elastic wave device of the present invention.

First, an example of computation results of the phase velocity of the Lamb wave ($\lambda=0°$, $\mu=125.25°$, $\theta=0°$ in Euler angle representation) in x1 axis direction of the AT-cut quartz is illustrated in FIG. 4. In computation, the thickness H of the quartz substrate is assumed to be 10 μm. The vertical axis of the figure indicates the phase velocity V and the horizontal axis indicates reference substrate thickness (kH/$\pi$=2$\pi$H/$\Lambda\pi$=2H/$\Lambda$). Many values are shown with a phase velocity of 10,000 m/s or more and it is found from the above-mentioned expression (Expression 12) that there exists a Lamb wave mode of which the frequency exceeds 1,000 MHz well. Thus, as the Lamb wave phase velocity is well over that of the surface acoustic wave, the Lamb wave is characterized by easy oscillating of high frequency up to GHz.

Figure 5:
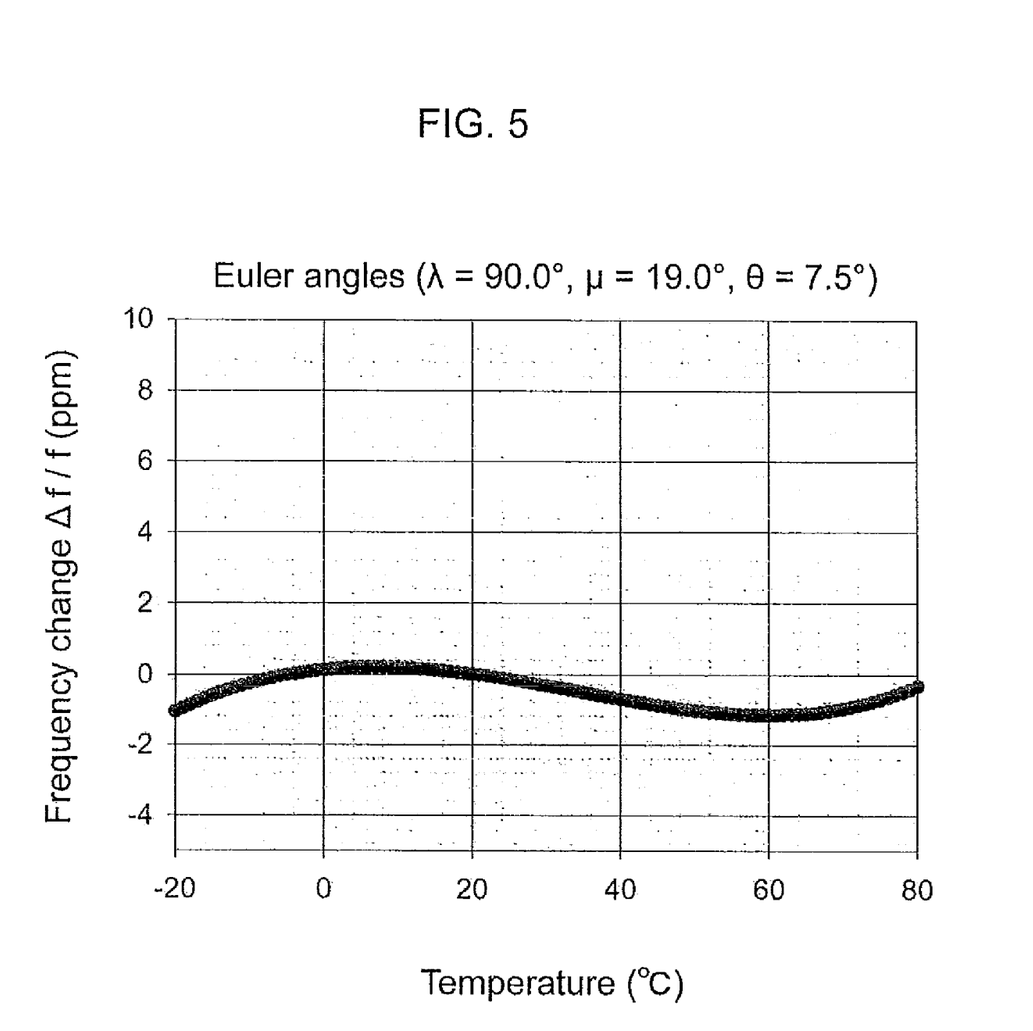
FIG. 5 is a view illustrating another example of computation results of frequency temperature characteristics of the Lamb wave type elastic wave device of the present invention.

In order to obtain a small value of the frequency temperature change $\Delta f/f$ in the Lamb wave on the quartz substrate, the inventors have conducted theoretical calculation with various values of $\lambda$, $\mu$, $\theta$. As a result, they have found that an extremely small value is obtained at $\lambda=90°$, $\mu=17°$ to 21° or $\mu=159°$ to 163°, $\theta=0°$ to 10°. FIG. 5 is a view illustrating a relation between $\Delta f/f$ and temperatures at $\lambda=90°$, $\mu=19°$, $\theta=7.5°$. Here, calculation is made at H/$\Lambda=0.9$. From the figure, it is found that $\Delta f/f$ is small and about 1.4 ppm or less over a whole range of −20° C. to +80° C.

Figure 6:
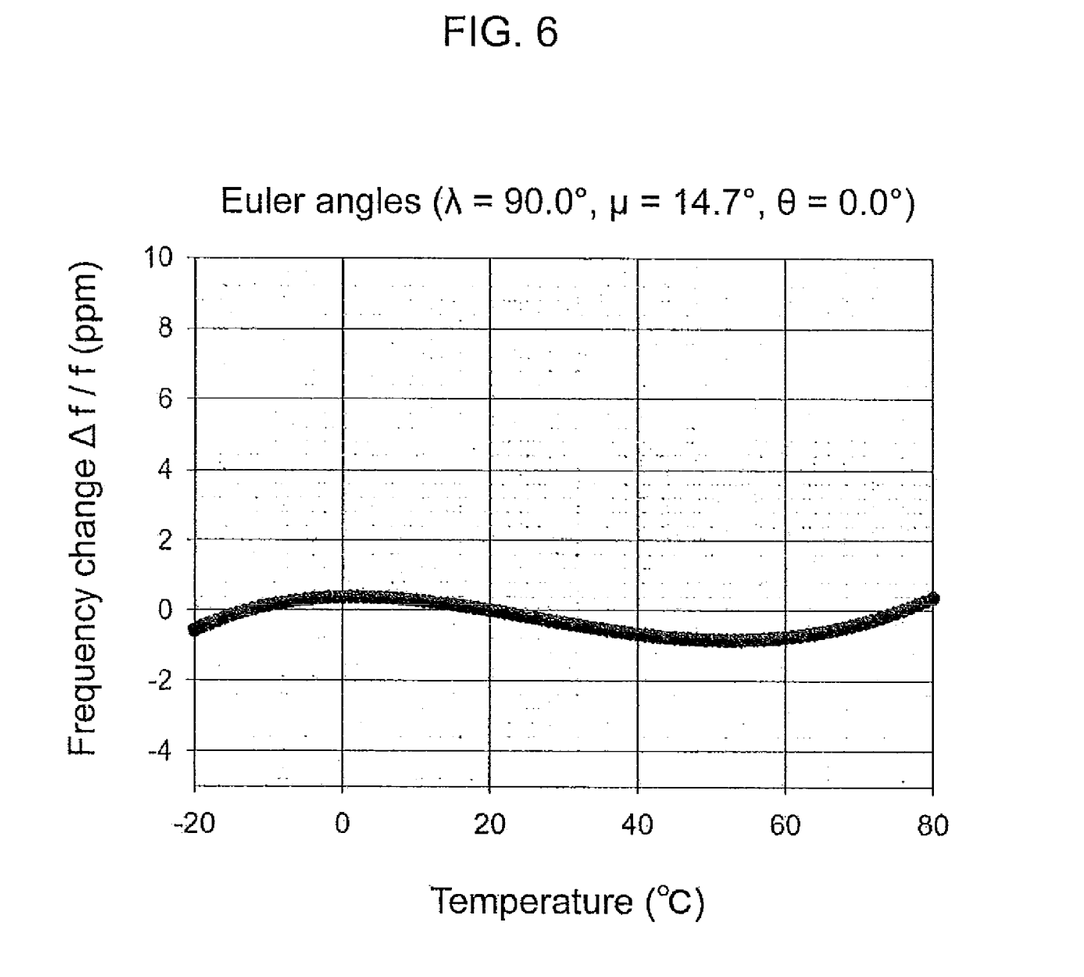
FIG. 6 is a view illustrating another example of computation results of frequency temperature characteristics of the Lamb wave type elastic wave device of the present invention.

It is also found that at $\lambda=90°$, $\mu=13$ to 16° or $\mu=164°$ to 167°, $\theta=0°$ to 10°, the value $\Delta f/f$ becomes extremely small. FIG. 6 illustrate a relation between $\Delta f/f$ and temperatures at $\lambda=90°$, $\mu=14.7°$, $\theta=0°$ (Computation is made with H/$\Lambda=1.01$). From the figure, it is found that $\Delta f/f$ is small and about 1.24 ppm or less over the whole range of −20° C. to +80° C.

Figure 7:
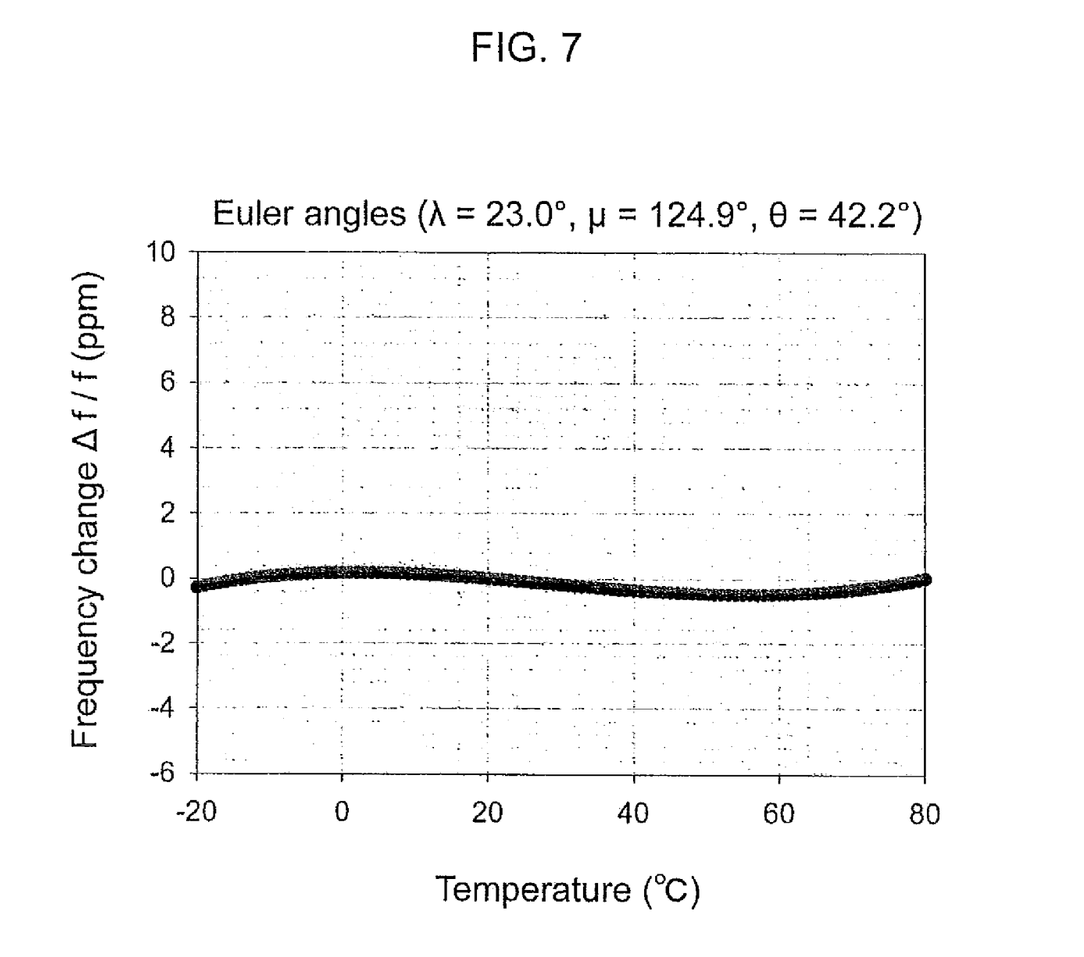
FIG. 7 is a view illustrating another example of computation results of frequency temperature characteristics of the Lamb wave type elastic wave device of the present invention.

Further, when the Euler angles are $\lambda=20$ to 25°, $\mu=120°$ to 130°, $\theta=40°$ to 45°, it is also found that the value $\Delta f/f$ becomes extremely small. FIG. 7 illustrate a relation between $\Delta f/f$ and temperatures at $\lambda=23°$, $\mu=124.9°$, $\theta=42.2°$ (Computation is made with H/$\Lambda=0.963$). The theoretical computation results show that $\Delta f/f$ is small and about 0.7 ppm or less over the whole range of −20° C. to +80° C.

Figure 8:
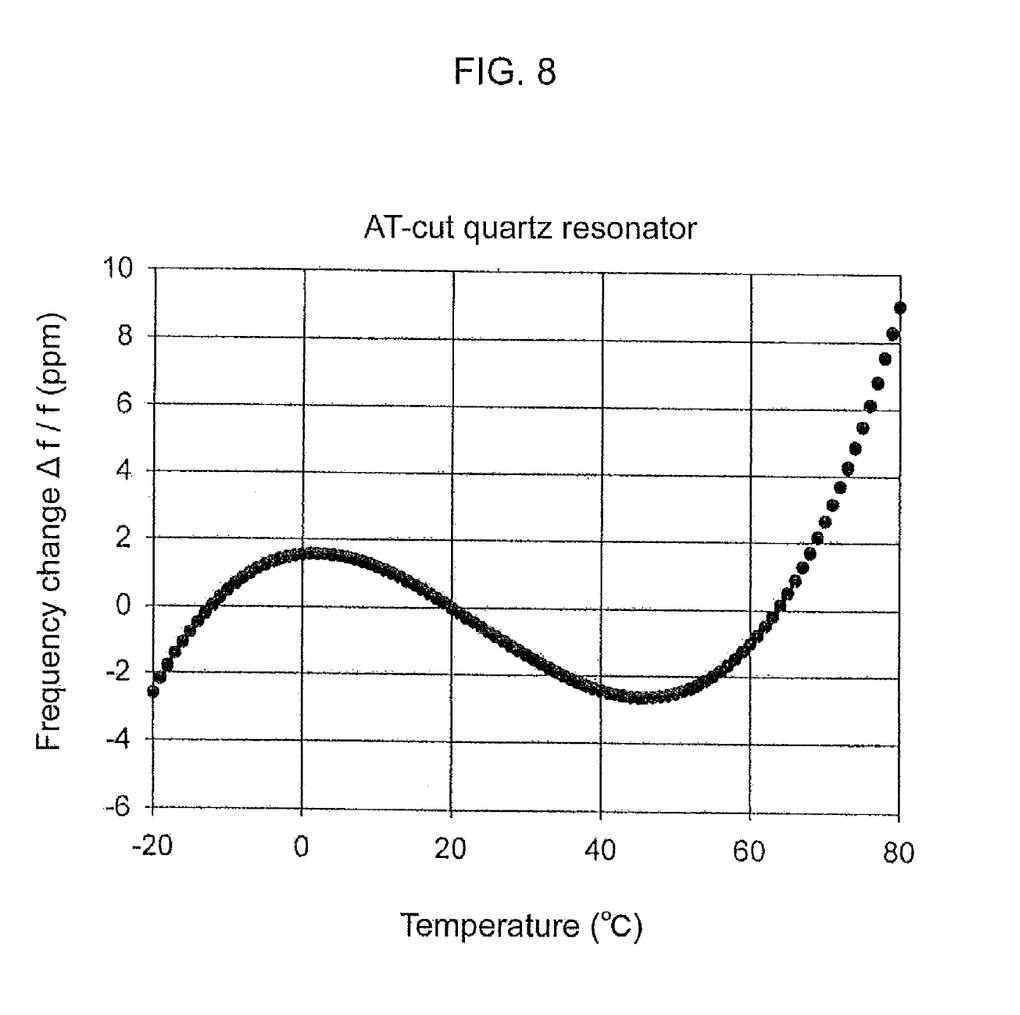
FIG. 8 is a view illustrating a view of computation results of frequency temperature characteristics of bulk wave on the AT-cut quartz substrate.

Meanwhile, the same computation is made on bulk wave (thickness-shear wave) on the AT-cut quartz substrate, which results are illustrated in FIG. 8 by way of an example. The frequency change in the computation results is about 12 ppm and matches the frequency temperature characteristics of the quartz resonator conventionally known by experience. From comparison of FIGS. 5 to 7 with FIG. 8, it is found that the frequency temperature characteristics of the Lamb wave type elastic wave device of the present invention are extremely excellent and the frequency temperature change is much smaller than or about one tenth of that of the conventional AT-cut quartz resonator.

Figure 1:
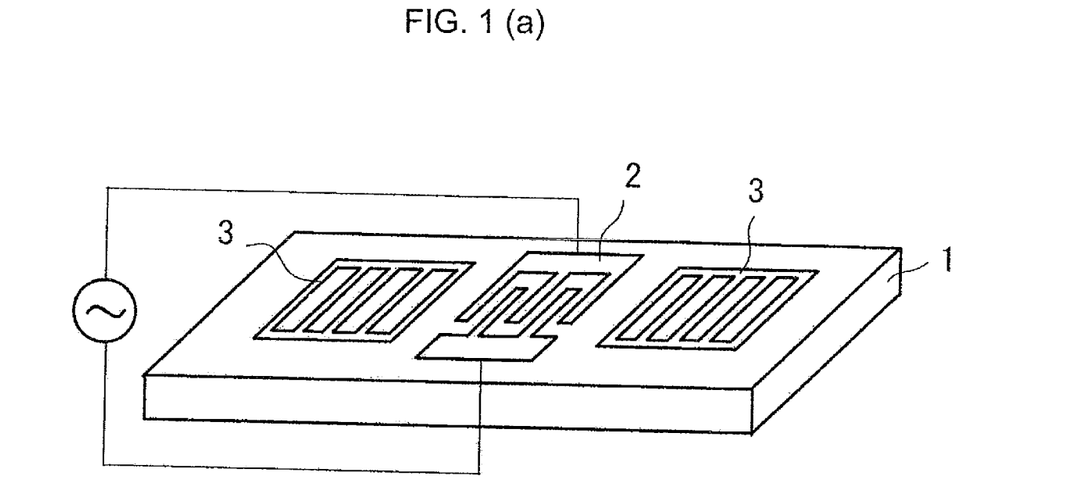
FIGS. 1(a) and 1(b) are diagrams each illustrating a configuration of a Lamb wave type high-frequency resonator according to an exemplary embodiment of the present invention.
Figure 9:
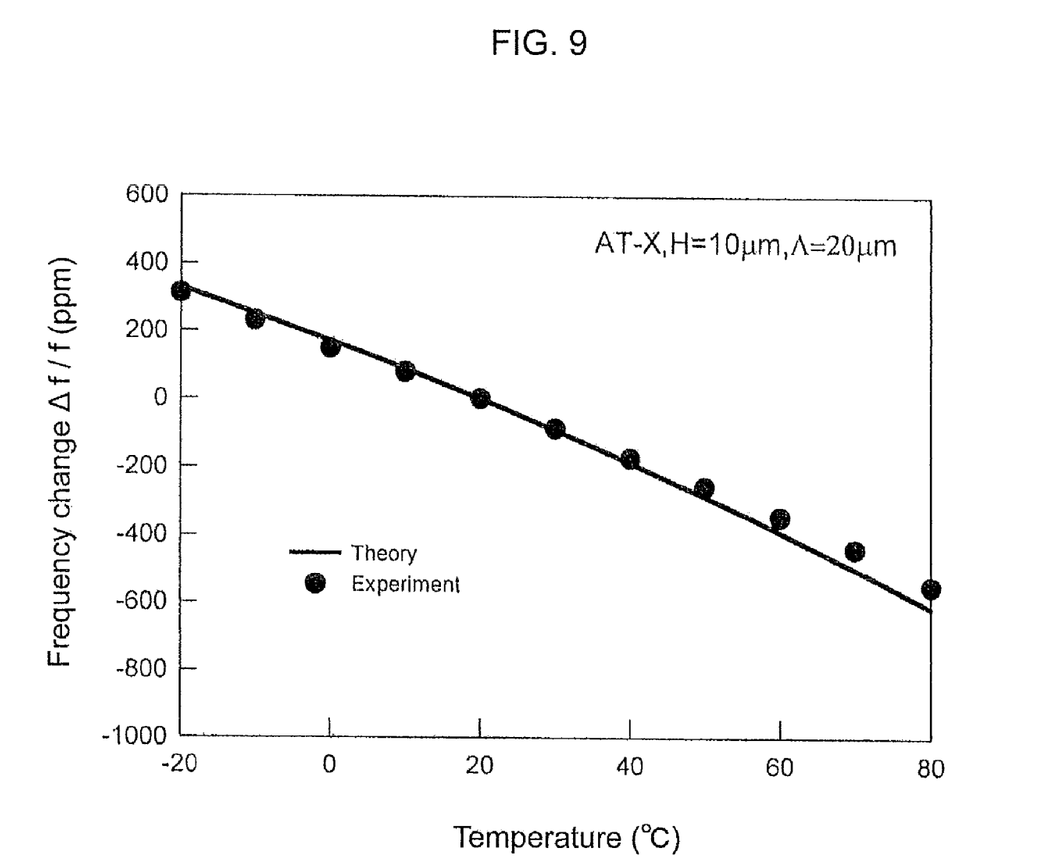
FIG. 9 is a view of comparison of computation results with measurement results of frequency temperature characteristics of the Lamb wave on the AT-cut quartz substrate.

Further, in order to investigate comparison between such theoretical computation values and measurement values, a Lamb wave resonator having an IDT and reflectors on the quartz substrate is created as illustrated in FIG. 1 and the temperature dependence of the frequency change is measured. The substrate used is an AT-cut quartz substrate with a diameter of 3 mm and a thickness of 10 μm, and the IDT and the reflectors are arranged to have a wavelength of 20 μm. FIG. 9 illustrates comparison between the measurement values and theoretical computation values at $\lambda=0°$, $\mu=125.25°$, $\theta=0°$ expressed in Euler angles. Both values are in very good agreement and it is established that the theoretical analysis used as a basis of the present invention is highly accurate.

Figure 10:
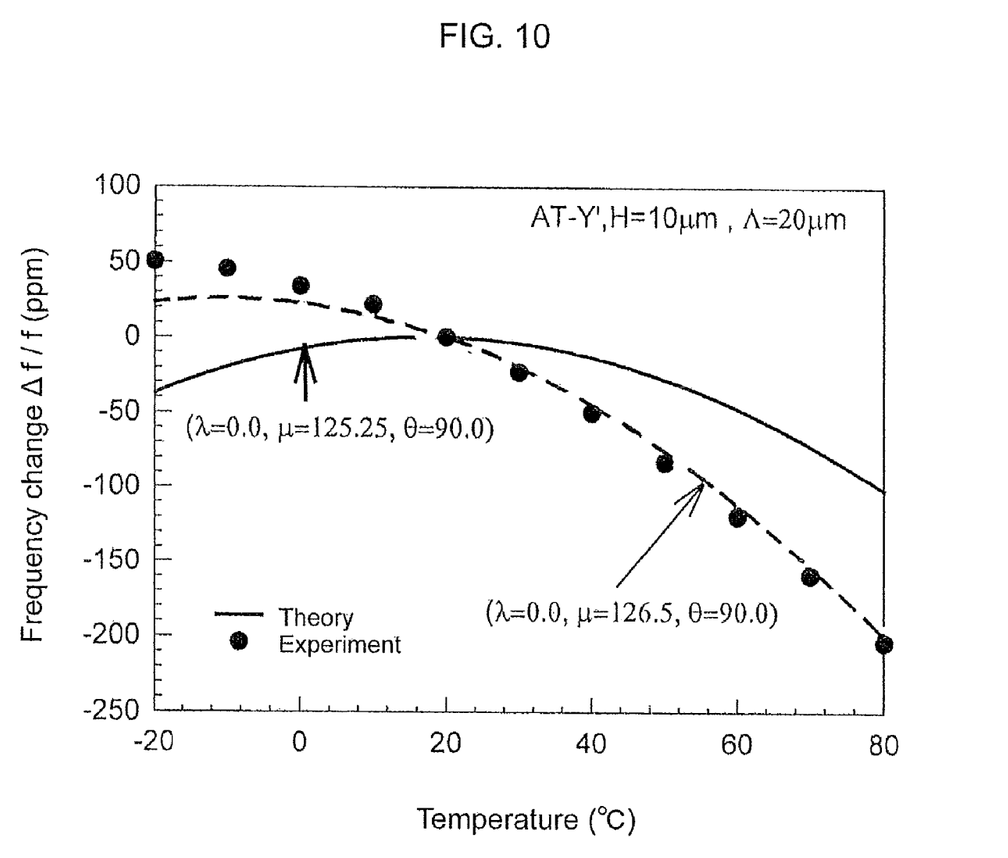
FIG. 10 is a view of comparison of computation results with measurement results of frequency temperature characteristics of the Lamb wave on the AT-cut quartz substrate.

Furthermore, FIG. 10 illustrates comparison between the measurement values and theoretical computation values at $\lambda=0°$, $\mu=125.25°$, $\theta=90°$ in the Euler angle representation (in which the cut angle is the same as that of FIG. 9 but the direction of the lamb wave is perpendicular thereto). The solid line indicates the computation results in the Euler angle representation, which results are slightly different from the measurement values. This difference seems to be caused by any measurement error of each material constant used in computation or variation of quartz crystal properties. Then, computation is made with $\lambda=0°$, $\mu=126.5°$, $\theta=90°$, which computation results are indicated by the broken line in FIG. 10. This broken line is shown in exact agreement with the measurement values. Therefore, for the optimal conditions of the Euler angles estimated in computation, it is preferable that three Euler angles are set each with a permissible range of about ±2° as it sometimes contain uncertain error due to variation of crystal properties and measurement error of each material constant.

The present application is based on Japanese Patent Application No. 2007-065991 filed on Mar. 15, 2007, and its contents are incorporated by reference herein.

The invention claimed is:

1. A Lamb wave type elastic wave device having an interdigital transducer for generating at least one Lamb wave type elastic wave, or the interdigital transducer and a reflector, arranged on a quartz substrate, a cut angle of the quartz substrate and a propagation direction of the Lamb wave type elastic wave expressed in Euler angles ($\lambda$, $\mu$, $\theta$) satisfying any one of following expressions (Expressions 1 to 3)

$$\lambda=88° \text{ to } 92°, \mu=17° \text{ to } 21° \text{ or } \mu=159° \text{ to } 163°, \theta=0° \text{ to } 10° \quad \text{(Expression 1)}$$

$$\lambda=208° \text{ to } 212°, \mu=17° \text{ to } 21° \text{ or } \mu=159° \text{ to } 163°, \theta=0° \text{ to } 10° \quad \text{(Expression 2)}$$

$$\lambda=328° \text{ to } 332°, \mu=17° \text{ to } 21° \text{ or } \mu=159° \text{ to } 163°, \theta=0° \text{ to } 10°. \quad \text{(Expression 3)}$$

2. The Lamb wave type elastic wave device of claim 1, wherein a ratio H/Λ of a thickness H of the quartz substrate to a periodic length Λ of the interdigital transducer ranges from 0.8 to 1.0.

3. A Lamb wave type elastic wave device having an interdigital transducer for generating at least one Lamb wave type elastic wave, or the interdigital transducer and a reflector, arranged on a quartz substrate, a cut angle of the quartz substrate and a propagation direction of the Lamb wave type elastic wave expressed in Euler angles ($\lambda$, $\mu$, $\theta$) satisfying any one of following expressions (Expressions 4 to 6)

$$\lambda=88° \text{ to } 92°, \mu=13° \text{ to } 16° \text{ or } \mu=164° \text{ to } 167°, \theta=0° \text{ to } 10° \quad \text{(Expression 4)}$$

$$\lambda=208° \text{ to } 212°, \mu=13° \text{ to } 16° \text{ or } \mu=164° \text{ to } 167°, \theta=0° \text{ to } 10° \quad \text{(Expression 5)}$$

$$\lambda=328° \text{ to } 332°, \mu=13° \text{ to } 16° \text{ or } \mu=164° \text{ to } 167°, \theta=0° \text{ to } 10°. \quad \text{(Expression 6)}$$

4. The Lamb wave type elastic wave device of claim 3, wherein a ratio H/Λ of a thickness H of the quartz substrate to a periodic length Λ of the interdigital transducer ranges from 0.9 to 1.1.

5. A Lamb wave type elastic wave device having an interdigital transducer for generating at least one Lamb wave type elastic wave, or the interdigital transducer and a reflector, arranged on a quartz substrate, a cut angle of the quartz substrate and a propagation direction of the Lamb wave type elastic wave expressed in Euler angles ($\lambda$, $\mu$, $\theta$) satisfying any one of following expressions (Expressions 7 to 9)

$$\lambda=20° \text{ to } 25°, \mu=120° \text{ to } 130°, \theta=40° \text{ to } 45° \quad \text{(Expression 7)}$$

$$\lambda=140° \text{ to } 145°, \mu=120° \text{ to } 130°, \theta=40° \text{ to } 45° \quad \text{(Expression 8)}$$

$$\lambda=260° \text{ to } 265°, \mu=120° \text{ to } 130°, \theta=40° \text{ to } 45°. \quad \text{(Expression 9)}$$

6. The Lamb wave type elastic wave device of claim 5, wherein a ratio H/Λ of a thickness H of the quartz substrate to a periodic length Λ of the interdigital transducer ranges from 0.9 to 1.1.

7. A Lamb wave type elastic wave device having an interdigital transducer for generating at least one Lamb wave type elastic wave, or the interdigital transducer and a reflector, arranged on a quartz substrate, a cut angle of the quartz substrate and a propagation direction of the Lamb wave type elastic wave expressed in Euler angles ($\lambda$, $\mu$, $\theta$) satisfying a following expression (Expression 10), and a ratio H/Λ of a thickness H of the quartz substrate to a periodic length Λ of the interdigital transducer is 0.9

$$\lambda=90°, \mu=18.997° \text{ or } \mu=180°-18.997°, \theta=7.5°. \quad \text{(Expression 10)}$$

8. A Lamb wave type elastic wave device having an interdigital transducer for generating at least one Lamb wave type elastic wave, or the interdigital transducer and a reflector, arranged on a quartz substrate, a cut angle of the quartz substrate and a propagation direction of the Lamb wave type elastic wave expressed in Euler angles ($\lambda$, $\mu$, $\theta$) satisfying a following expression (Expression 11), and a ratio H/Λ of a thickness H of the quartz substrate to a periodic length Λ of the interdigital transducer is 0.9

$$\lambda=90°, \mu=14.715° \text{ or } \mu=180°-14.715°, \theta=0°. \quad \text{(Expression 11)}$$

9. A high-frequency resonator comprising the Lamb wave type elastic wave device of any one of claims 1 to 8.

* * * * *